United States Patent
Zhu et al.

(10) Patent No.: US 10,388,621 B2
(45) Date of Patent: Aug. 20, 2019

(54) METHOD FOR MAKING NANOSCALE DEVICES WITH FRACTAL NANOSTRUCTURES

(71) Applicants: Tsinghua University, Beijing (CN); HON HAI PRECISION INDUSTRY CO., LTD., New Taipei (TW)

(72) Inventors: Zhen-Dong Zhu, Beijing (CN); Qun-Qing Li, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/959,363

(22) Filed: Apr. 23, 2018

(65) Prior Publication Data

US 2018/0315724 A1    Nov. 1, 2018

(30) Foreign Application Priority Data

Apr. 28, 2017 (CN) .......................... 2017 1 0295872

(51) Int. Cl.
| | |
|---|---|
| *H01L 21/47* | (2006.01) |
| *H01L 21/02* | (2006.01) |
| *H01L 21/477* | (2006.01) |
| *H01L 21/48* | (2006.01) |
| *H01L 23/00* | (2006.01) |
| *B82Y 40/00* | (2011.01) |
| *B82Y 20/00* | (2011.01) |

(52) U.S. Cl.
CPC .............. *H01L 24/11* (2013.01); *B82Y 20/00* (2013.01); *B82Y 40/00* (2013.01); *H01L 21/02513* (2013.01); *H01L 21/02601* (2013.01); *H01L 21/47* (2013.01); *H01L 21/477* (2013.01); *H01L 21/4853* (2013.01); *H01L 24/14* (2013.01); *H01L 24/17* (2013.01)

(58) Field of Classification Search
None
See application file for complete search history.

(56) References Cited

U.S. PATENT DOCUMENTS

| | | | |
|---|---|---|---|
| 8,501,020 B2* | 8/2013 | Zhu ..................... | B81C 1/00031 216/11 |
| 2010/0084628 A1* | 4/2010 | Lee ......................... | C30B 11/12 257/9 |
| 2010/0240144 A1* | 9/2010 | Gilbert ................. | G01N 21/658 436/169 |
| 2011/0206903 A1* | 8/2011 | Mazumder .............. | C03C 17/28 428/161 |

* cited by examiner

*Primary Examiner* — Bo B Jang
(74) *Attorney, Agent, or Firm* — ScienBiziP, P.C.

(57) ABSTRACT

A method of making nanoscale devices, the method including: depositing a metal film on a surface of a first substrate; annealing the metal film to form a plurality of metal island structures on the surface of the first substrate; laying metal nanospheres on the surface of the first substrate; baking the first composite structure to make the metal nanospheres become a plurality of metal crystalline balls; forming a photoresist layer on the first surface of the second composite structure; placing a release agent layer on a second substrate, applying an external force to press the photoresist layer on the release agent layer under an inert atmosphere; heating the second composite structure, the photoresist layer, the release agent layer, and the second substrate are and applying voltages in three stages.

11 Claims, 5 Drawing Sheets

METHOD FOR MAKING NANOSCALE DEVICES WITH FRACTAL NANOSTRUCTURES

RELATED APPLICATIONS

This application claims all benefits accruing under 35 U.S.C. § 119 from China Patent Application No. 201710295872.9, filed on Apr. 28, 2017, in the China Intellectual Property Office, the disclosure of which is incorporated herein by reference.

BACKGROUND

1. Technical Field

The subject matter herein generally relates to a method for making nanoscale devices.

Nanotechnology refers to methods for making nanoscale structures on semiconductors, metals or other materials according to need. The nanoscale devices have some favorable properties because of the nanoscale structures and the materials themselves.

Therefore, methods for making nanoscale devices and solving the problem associated therewith can be desired.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views. Implementations of the present technology will now be described, by way of example only, with reference to the attached figures, wherein.

DETAILED DESCRIPTION

Figure 1:
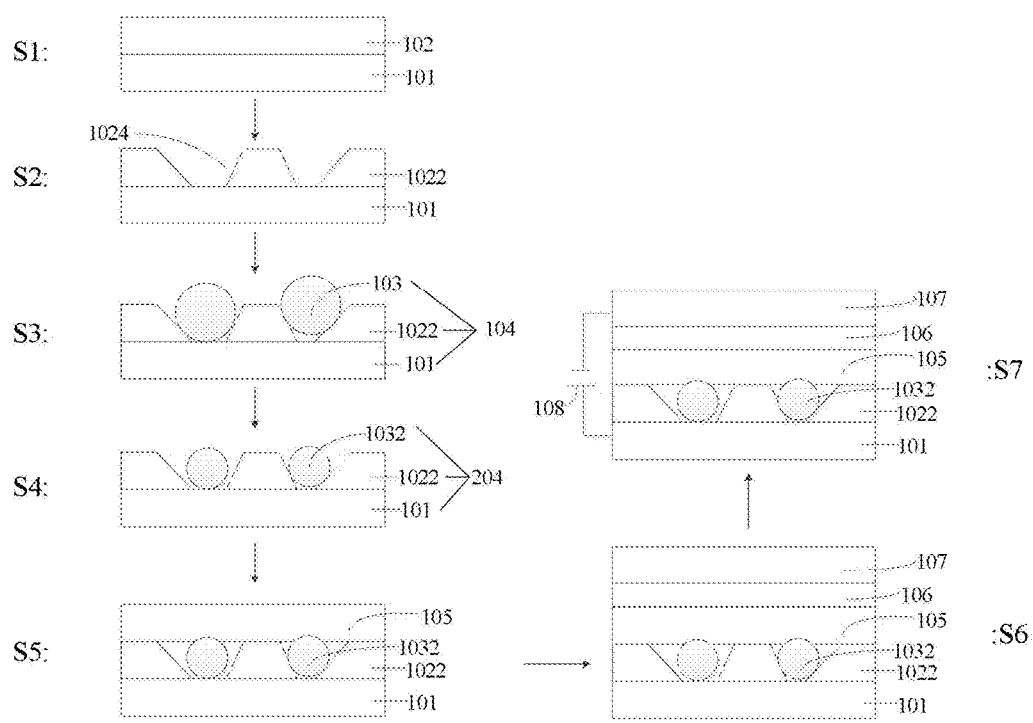
FIG. 1 is a flow chart of one embodiment of a method for making nanoscale devices.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale, and the proportions of certain parts may be exaggerated to better illustrate details and features. The description is not to be considered as limiting the scope of the embodiments described herein.

Several definitions that apply throughout this invention will now be presented.

The connection can be such that the objects are permanently connected or releasably connected. The term "substantially" is defined to be essentially conforming to the particular dimension, shape or other word that substantially modifies, such that the component need not be exact. The term "comprising" means "including, but not necessarily limited to"; it specifically indicates open-ended inclusion or membership in a so-described combination, group, series and the like. It should be noted that references to "an" or "one" embodiment in this disclosure are not necessarily to the same embodiment, and such references mean at least one.

Figure 2:
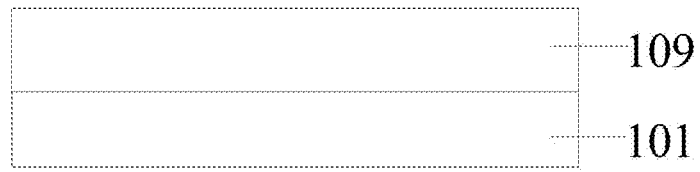
FIG. 2 is a flow chart of one embodiment of a method for making nanoscale devices.

Referring to FIG. 1 and FIG. 2, an embodiment of a method of making nanoscale devices comprises:

S1, depositing a metal film 102 on a surface of a first substrate 101;

S2, annealing the metal film 102 to form a plurality of metal island structures 1022 on the surface of the first substrate 101;

S3, laying metal nanospheres 103 on the surface of the first substrate 101 on which the plurality of metal island structures 1022 are formed, wherein the first substrate 101, the plurality of metal island structures 1022 and the metal nanospheres 103 form a first composite structure 104, and the first composite structure 104 defines a first surface away from the first substrate 101;

S4, baking the first composite structure 104 to make the metal nanospheres 103 become a plurality of metal crystalline balls 1032, wherein the first substrate 101, the plurality of metal island structures 1022, and the metal crystalline balls 1032 form a second composite structure 204;

S5, forming a photoresist layer 105 on the second composite structure 204;

S6, placing a release agent layer 106 on a second substrate 107, applying an external force to press the photoresist layer 105 on the release agent layer 106 under an inert atmosphere or a vacuum condition;

S7, heating the second composite structure 204, the photoresist layer 105, the release agent layer 106, and the second substrate 107 and applying different voltages between the first substrate 101 and the second substrate 107 in three stages, wherein the voltages cause the plurality of metal island structures 1022 and the plurality of metal crystalline balls 1032 to form a single fractal nanostructure 109 on the first substrate 101.

In step S1, the first substrate 101 can have a smooth surface, and can be an insulating substrate, a semiconductor substrate or a metal substrate. The material of the first substrate 101 can be gallium nitride, gallium arsenide, sapphire, aluminum oxide, magnesium oxide, silicon, silicon dioxide, silicon nitride, quartz, glass or high temperature polymer. The material of the first substrate 101 can also be doped semiconductor material such as P-type gallium nitride, N-type gallium nitride. The size, the thickness and the shape of the first substrate 101 can be selected according to need. The surface roughness of the first substrate 101 is less than 1 nanometer, which can contribute to match the lattice constant of the metal film 102.

The first substrate 101 can be hydrophilized to improve the hydrophilicity of the surface of the first substrate 101. When the material of the first substrate 101 is gallium nitride, the method of hydrophilically treating the first substrate 101 may include the following steps: firstly, cleaning the first substrate 101 by using ultra-clean standard process; secondly, hydrophilically treating the first substrate 101 with microwave plasma. The first substrate 101 can be placed into a microwave plasma system, wherein an inductive power source of the microwave plasma system can generate plasma such as oxygen plasma, chlorine plasma or argon plasma. The plasma diffuses and drifts from the inductive power source to the surface of the first substrate 101 with a lower energy to improve the hydrophilicity of the first substrate 101.

In one embodiment, the first substrate 101 is K9 glass plate. The method of hydrophilically treating the first substrate 101 includes the following steps: firstly, cleaning the first substrate 101 by using ultra-clean standard process; secondly, water-treating the first substrate 101 in a solution at a temperature of 30-100 degrees Celsius fin 30-60 minutes. After hydrophilically treating, the first substrate 101, the first substrate 101 can be rinsed with deionized water for two or three times. The volume ratio of the solution is $NH_3 \cdot H_2O:H_2O_2:H_2O=x:y:z$, wherein the value of x can be 0.2-2, the value of y can be 0.2-2, and the value of z can be 1-20. Finally, the first substrate 101 can be blown dry with nitrogen.

The method of depositing the metal film 102 on the surface of the first substrate 101 can be electron beam evaporation method, ion beam sputtering method, or magnetron sputtering method. The material of the metal film 102 can be gold, silver, platinum, palladium, titanium, copper, or aluminum. The thickness of the metal film 102 can be of 1 nanometer to 50 nanometers.

In step S2, after the temperature of the metal film 102 cools to room temperature, the metal film 102 is annealed. The method of annealing the metal film 102 comprises:

S21, placing the first substrate 101 with the metal film 102 in an annealing furnace;

S22, filling nitrogen gas or argon gas or other inert gas, or evacuating the annealing furnace; and S23, raising the temperature of the annealing furnace to 140-240 degrees Celsius, and keeping for 5 minutes to 90 minutes.

Figure 3:
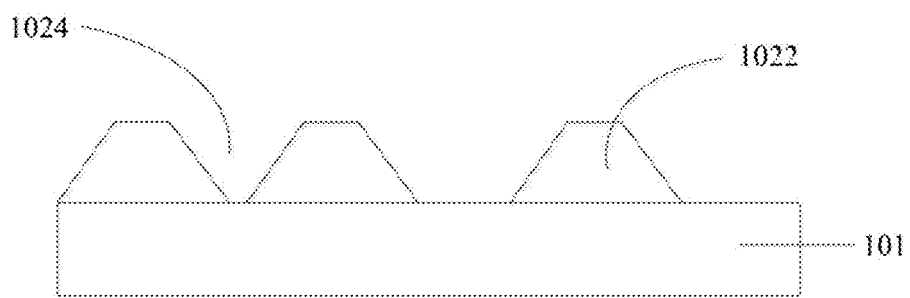
FIG. 3 is a schematic view of a cross-sectional structure of one embodiment of a metal island structure formed by annealing a metal film.

Referring to FIG. 3, in the annealing process, a surface tension can be generated in the metal film 102. The surface tension ruptures the metal film 102 to form the plurality of metal island structures 1022. The metal island structures 1022 are spaced apart from each other and located on the surface of the first substrate 101 and form a plurality of gaps 1024. Each metal island structure can be a seed of the subsequent fractal growth of metal nanomaterials.

In one embodiment, the metal film 102 is a gold film, and the thickness of the gold film is 40 nanometers. The temperature of annealing treatment is 200 degrees Celsius, and the plurality of metal island structures 1022 are formed by keeping at the temperature for 5 minutes.

Figure 4:
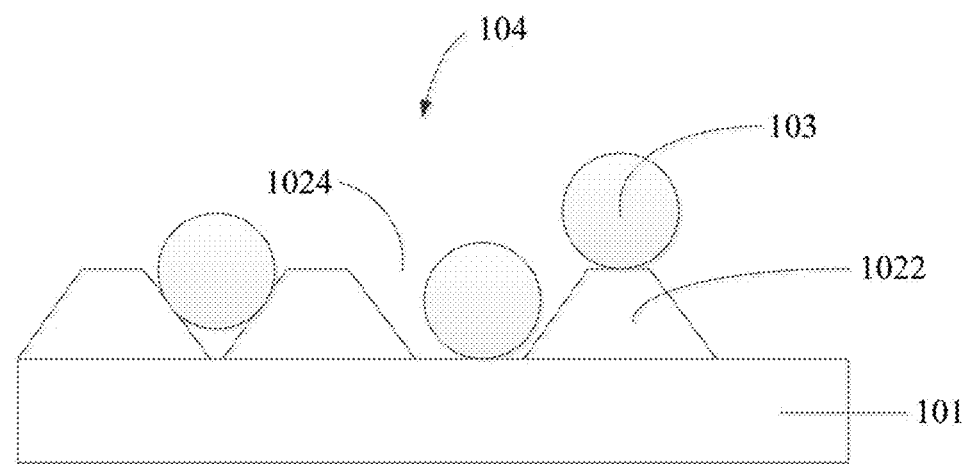
FIG. 4 is a schematic view of a cross-sectional structure of one embodiment of a composite structure by laying metal nanospheres on a surface of the metal island structure.

In step S3, the method of laying the metal nanospheres 103 can be spin a coating method or Czochralski method. The material of the metal nanospheres 103 can be the same as or different from the material of the metal film 102. The diameter of the metal nanospheres 103 can be selected according to need. For example, the diameter of the metal nanospheres 103 can be of 2 nanometers to 100 nanometers. Referring to FIG. 4, after laying the metal nanospheres 103, the metal nanospheres 103 are distributed on a surface of the metal island structures 1022, or in the gaps 1024 between two adjacent metal island structures 1022. When the size of the gaps 1024 is greater than the size of the metal nanospheres 103, the metal nanospheres 103 are directly distributed on and in direct contact with the surface of the first substrate 101. The term "size" refers to the diameter of the gaps. The first substrate 101, the plurality of metal island structures 1022 and the metal nanospheres 103 form a first composite structure 104, and the first composite structure 104 defines the first surface away from the first substrate 101.

In one embodiment, the metal nanospheres 103 are gold nanospheres formed by the Czochralski method. The Czochralski method of laying the metal nanospheres 103 on the surface of the first substrate 101 comprises:

S31, preparing a gold nanospheres solution;

S32, laying the metal nanospheres 103 on the surface of the first substrate 101 having the plurality of metal island structures 1022.

In step S31, the gold nanospheres solution is formed by adding pure water, gold nanospheres, and sodium dodecyl sulfate (SDS) into a watch glass. In one embodiment, the diameter of the watch glass is 15 millimeters, and the volume of the pure water is 150 microliters. The volume of the gold nanospheres is of 3 microliters to 5 microliters, the concentration of the gold nanospheres is of 0.01 wt %-10 wt %. The concentration of the SDS is of 0.1 wt %-3 wt %. The gold nanospheres solution is in the watch glass for 30 minutes to 60 minutes. The diameter of the gold nanospheres is of 2 nanometers to 100 nanometers. The diameter of the watch glass can also be selected according to need, such as of 15 millimeters to 38 millimeters. The concentration of the gold nanospheres solution in the watch glass can also be modulated according to need.

In step S32, the method of laying the metal nanospheres 103 on the surface of the first substrate 101 comprises:

Firstly, sliding down the first substrate 101 having the plurality of metal island structures 1022 thereon slowly into the gold nanospheres solution of the watch glass along a side wall of the watch glass. The inclination angle of the first substrate 101 is of 9 degrees to 15 degrees.

Then, lifting the first substrate 101 slowly out of the gold nanospheres solution of the watch glass. In one embodiment, the first substrate 101 is lifted horizontally. The sliding-down speed and the lifting speed are both of 5 millimeters/hour to 10 millimeters/hour.

In step S4, the first composite structure 104 is placed on a hot plate (no shown) to bake under inert atmosphere or vacuum conditions. The temperature of the hot plate is of 140 degrees Celsius to 240 degrees Celsius, and the baking time is of 0.5 minutes to 1 minute. Baking the first composite structure 104 enhances the adhesion between the metal nanospheres 103 and the plurality of metal island structures 1022. The baking temperature and the baking time can be set according to the size of the metal nanospheres 103. When the size of the metal nanospheres 103 is less than 10 nanometers, the baking temperature can be reduced and the baking time can be shortened. When the size of the metal nanospheres 103 is larger than 90 nanometers, the baking temperature can be increased and the baking time can be prolonged. The metal nanospheres 103 can melt and shrink into individual metal crystalline balls 1032 due to the reduction of the barrier of the metal nanospheres 103 by heating in an environment of 140 degrees Celsius to 240 degrees Celsius. The metal crystalline balls 1032 are dispersed on the surface of the plurality of metal island structures 1022 or in the gaps 1024 between the metal island structures 1022. When the size of the gaps 1024 is greater than the size of the metal crystalline balls 1032, the metal crystalline balls 1032 are directly distributed on and in direct contact with the surface of the first substrate 101. At this time, the first substrate 101, the plurality of metal island structures 1022, and the metal crystalline balls 1032 can form a second composite structure 204.

There are metal nanomaterials on the surface of the first substrate 101, wherein the metal nanomaterials includes the metal island structures 1022 and the metal crystalline balls 1032.

In step S5, the photoresist layer 105 can be formed on the second composite structure 204 by using a screen printing method or a spin coating method. The material of the photoresist layer 105 can be polymethyl methacrylate (PMMA), SU-8, polystyrene, or polystyrene-block-polymethyl methacrylate. The thickness of the photoresist layer 105 can be selected according to need. In one embodiment, the material of the photoresist layer 105 is nanoimprint photoresist (reference to U.S. Pat. No. 8,344,065). The nanoimprint photoresist includes high branched oligomers, perfluoroethyl polyethers, methyl methacrylates, and organic diluents. The mass percentage content of the high branched oligomers is 50%-60%. The mass percentage content of the perfluoroethyl polyethers is 3%-5%. The mass percentage content of the methyl methacrylates is 5%-10%. The mass percentage content of the organic diluents is 25%-35%. In one embodiment, a surface of the second composite structure 204 is coated with the nanoimprint photoresist by spin coating. The speed of spin coating is of 5400 rev/min-7000 rev/min. The time of spin coating is of 0.5 minutes to 1.5 minutes. Then the photoresist layer 105 is baked at a temperature of 100 degrees Celsius to 120 degrees Celsius for 2 minutes to 4 minutes and formed on the surface of the second composite structure 204. The thickness of the photoresist layer 105 is of 20 nanometers to 200 nanometers. The speed of spin coating should be reduced to protect the metal crystalline balls 1032 from leaving the metal island structures 1022 to cluster due to centrifugal force.

In step S6, the material of the second substrate 107 can be gallium nitride, gallium arsenide, sapphire, aluminum oxide, magnesium oxide, silicon, silicon dioxide, silicon nitride, quartz, or glass. The size and the shape of the second substrate 107 can be selected according to need. The material of the release agent layer 106 can be inorganic release agent, organic release agent or polymer release agent. The release agent layer 106 can be coated on the surface of the second substrate 107 by using a sprayer or a brush.

The inert atmosphere or the vacuum condition can prevent the metal nanomaterials from being oxidized by oxygen. The photoresist layer 105 and the release agent layer 106 are pressed together by applying the external force.

In step S7, after the photoresist layer 105 and the release agent layer 106 being pressed together by applying the external force, the first substrate 101 and the second substrate 107 are electrically connected to a power source 108 respectively. The first substrate 101 and the second substrate 107 are connected to the positive electrode and the negative electrode of the power source 108. For example, the first substrate 101 can be connected to the positive electrode of the power source 108, and the second substrate 107 can be connected to the negative electrode of the power source 108. Alternatively, the first substrate 101 can also be connected to the negative electrode of the power source 108, and the second substrate 107 can also be connected to the positive electrode of the power source 108. The second composite structure 204, the photoresist layer 105, the release agent layer 106, and the second substrate 107 are heated in three stages, which can increase the temperature from room temperature to a range of 210 degrees Celsius to 230 degrees Celsius. The voltages are applied between the first substrate 101 and the second substrate 107 at each stage. The three stages comprise:

Stage 1, the second composite structure 204, the photoresist layer 105, the release agent layer 106, and the second substrate 107 are heated to a first temperature of 90 degrees Celsius to 140 degrees Celsius and kept at the first temperature for a first period of 5 minutes to 20 minutes, and the voltage applied between the first substrate 101 and the second substrate 107 is 200 volts-600 volts;

Stage 2, the second composite structure 204, the photoresist layer 105, the release agent layer 106, and the second substrate 107 are heated to a second temperature of 160 degrees Celsius to 200 degrees Celsius from the first temperature and kept at the second temperature for a second period of 10 minutes to 40 minutes, the voltage applied between the first substrate 101 and the second substrate 107 is 1200 volts-2000 volts;

Stage 3, the second composite structure 204, the photoresist layer 105, the release agent layer 106, and the second substrate 107 are heated to a third temperature of 210 degrees Celsius to 250 degrees Celsius from the second temperature and kept at the third temperature for a third period of 10 minutes to 40 minutes, the voltage applied between the first substrate 101 and the second substrate 107 is 200 volts-800 volts.

In one embodiment, the second composite structure 204 and the second substrate 107 are placed between two platen plates of a nanoimprint machine, wherein the second composite structure 204 is in direct contact with a platen plate and the second substrate 107 is in direct contact with the other platen plate. The photoresist layer 105 and the release agent layer 106 are pressed tightly together in anodic bonding mode of the nanoimprint machine. The vacuum of the nanoimprint machine is set to 5.0E-03 mbar. The applied pressure is of 12 pounds per square foot to 15 pounds per square foot (Psi). The three stages are operated in the nanoimprint machine. In stage 1, the second composite structure 204, the photoresist layer 105, the release agent layer 106, and the second substrate 107 are heated to 105 degrees Celsius and kept at this temperature for 7 minutes; the voltage applied between the first substrate 101 and the second substrate 107 is 400 volts; this stage is a seed activation stage. In stage 2, the second composite structure 204, the photoresist layer 105, the release agent layer 106, and the second substrate 107 are heated to 185 degrees Celsius and kept at this temperature for 20 minutes; the voltage applied between the first substrate 101 and the second substrate 107 is 1400 volts; this stage is a growth stage of fractal nanostructures. In stage 3, the second composite structure 204, the photoresist layer 105, the release agent layer 106, and the second substrate 107 are heated to 210 degrees Celsius and kept at this temperature for 30 minutes; the voltage applied between the first substrate 101 and the second substrate 107 is 500 volts; this stage is an ashing photoresist and seed inactivation stage. The stage 1 is the activation stage of the metal island structures 1022; the stage 2 is the fractal growth stage of the metal crystalline balls 1032 using the metal island structures 1022 as seeds; the stage 3 is the stage of asking the photoresist layer 105 and the stage of terminating the fractal growth of the metal crystalline balls 1032. A first heating process of the stage 1 and a second heating process of the stage 2 can accumulate energy for the activation of the metal island structures 1022 and the fractal growth of the metal crystalline balls 1032.

In stage 2, when the voltage applied between the first substrate 101 and the second substrate 107 is 1400 volts, the high intensity supply voltage provides energy for the migration of the metal crystalline balls 1032, wherein the energy can allow the metal crystalline balls 1032 to migrate and accumulate on the surface of the first substrate 101. The external force applied to the first substrate 101 and the second substrate 107 can make the metal crystalline balls 1032 not to migrate and cluster in a direction perpendicular to the surface of the first substrate 101. The external three applied to the first substrate 101 and the second substrate 107 can make the metal crystalline balls 1032 to migrate and cluster in a direction parallel to the surface of the first substrate 101. The metal island structures 1022 formed by the metal film 102 have defects due to dislocations. Part of the metal crystalline balls 1032 can accumulate at the defects of the metal island structures 1022 to form a sharp edge by using the metal island structures 1022 as nuclei. Then, the other part of the metal crystalline balls 1032 converge near the sharp edge, and accumulate along a direction of the sharp edge to grow up gradually. Finally, a fractal nanostructure is formed on the surface of the first substrate 101.

In stage 3, the applied voltage decreases from 1400 volts to 500 volts. The metal crystalline balls 1032 can not be provided sufficient energy for the fractal growth. So the fractal growth is terminated in stage 3. In this stage, the temperature is 210 degrees Celsius, wherein 210 degrees Celsius is basically the decomposition temperature of the organic polymer. The photoresist of the photoresist layer 105 can be decomposed and ashed in stage 3.

After the stage 3, the temperature decreases to below 100 degrees Celsius and the power source is turned off. Furthermore, the first substrate 101 and the fractal nanostructure 109 is separated from the second substrate 107.

In one embodiment, the nanoscale devices comprise the first substrate 101 and the fractal nanostructure 109 formed on the first substrate 101.

Figure 5:
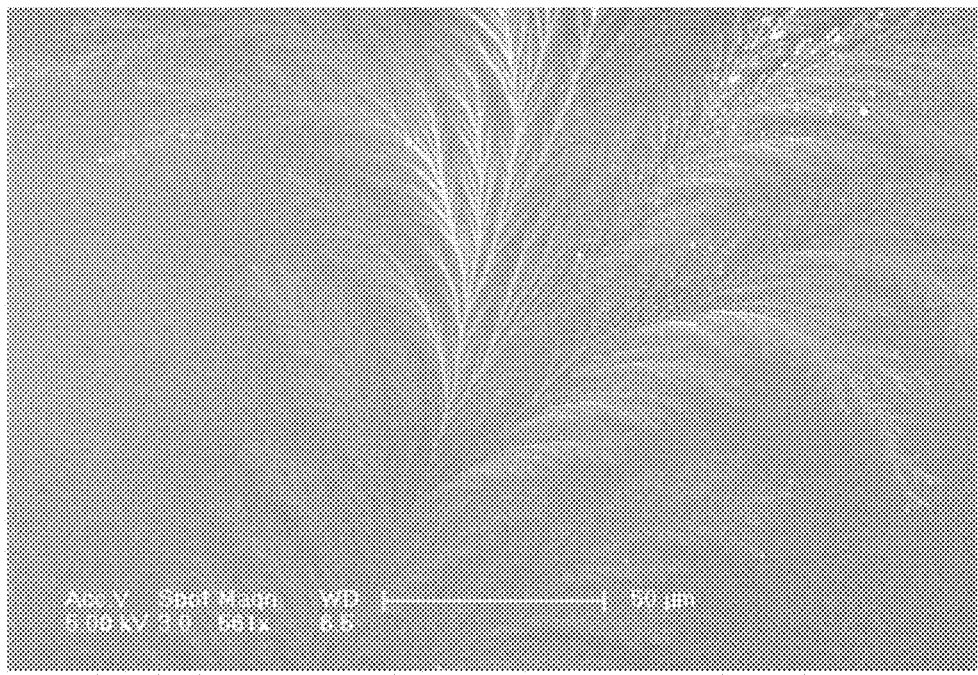
FIG. 5 is a SEM image of surface structures of the nanoscale devices.

Referring to FIG. 5, FIG. 5 is a SEM image of surface structures of the nanoscale devices. A fractal pattern of dendritic shape is formed on the surface of the nanoscale devices.

The method of making the nanoscale devices includes some advantages. Firstly, metallic nanomaterials can be rapidly fractal grown to form fractal nanostructures on the substrate under the effect of applied voltage, applied pressure, and high temperature. Secondly; a nanoscale structure can be formed on the substrate without using a mask and expensive etching equipment. The method is simple, which can reduce production costs and contribute to extensive application of nanoscale devices. Thirdly, the substrate for the metal nanomaterials to be fractal grown can be selected according to need. The method is simple and convenient, and can be used in different fields of nanoscale devices. Fourthly, the material of the metal film 102 and the material of the metal crystalline balls 1032 can be selected according to need. When the materials of the metal film 102 and the metal crystalline balls 1032 are different, the fractal growth of the metal nano-hybrid material on the substrate can be realized. Firstly, the fractal nanostructures on the surface of nanoscale devices can provide large surface area and a plurality of nanoscale gaps. The nanoscale devices can be applied in broad band optical perfect absorption field, military shadow imaging field, metal nanocatalysis field, single molecule detection field, and fractal nano-etching field. The method can be used for preparing a photoelectric conversion element, a surface enhanced Raman scattering substrate, a biochemical sensor and a refractive index sensor.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure up to, and including, the full extent established by the broad general meaning of the terms used in the claims.

Depending on the embodiment, certain of the steps of methods described may be removed, others may be added, and the sequence of steps may be altered. The description and the claims drawn to a method may comprise some indication in reference to certain steps. However, the indication used is only to be viewed for identification purposes and not as a suggestion as to an order for the steps.

What is claimed is:

1. A method of making nanoscale devices, the method comprising:
    depositing a metal film on a first surface of a first substrate;
    annealing the metal film to form a plurality of metal island structures on the first surface of the first substrate;
    laying metal nanospheres on the first surface of the first substrate, wherein the first substrate, the plurality of metal island structures and the metal nanospheres form a first composite structure;
    baking the first composite structure to make each of the metal nanospheres become one of a plurality of metal crystalline balls, wherein the first substrate, the plurality of metal island structures, and the plurality of metal crystalline balls form a second composite structure, and the second composite structure defines a second surface away from the first substrate;
    forming a photoresist layer on the second surface of the second composite structure;
    placing a release agent layer on a second substrate, applying an external force to press the photoresist layer on the release agent layer in an inert atmosphere or a vacuum environment;
    heating the second composite structure, the photoresist layer, the release agent layer, and the second substrate, applying a voltage between the first substrate and the second substrate, wherein the plurality of metal island structures and the plurality of metal crystalline balls form a fractal nanostructure on the first substrate.

2. The method as claimed in claim 1, wherein heating the second composite structure, the photoresist layer, the release agent layer, and the second substrate, and applying a voltage between the first substrate and the second substrate comprises:
    stage 1, the second composite structure, the photoresist layer, the release agent layer, and the second substrate are heated to a first temperature of 90 degrees Celsius to 140 degrees Celsius and kept at the first temperature for a first period of 5 minutes to 20 minutes, and a first voltage applied between the first substrate and the second substrate is 200 volts-600 volts;
    stage 2, the second composite structure, the photoresist layer, the release agent layer, and the second substrate are heated to a second temperature of 160 degrees Celsius to 200 degrees Celsius from the first temperature and kept at the second temperature for a second period of 10 minutes to 40 minutes, a second voltage applied between the first substrate and the second substrate is 1200 volts-2000 volts;

stage 3, the second composite structure, the photoresist layer, the release agent layer, and the second substrate are heated to a third temperature of 210 degrees Celsius to 250 degrees Celsius from the second temperature and kept at the third temperature for a third period of 10 minutes to 40 minutes, a third voltage applied between the first substrate and the second substrate is 200 volts-800 volts.

3. The method as claimed in claim 2, wherein the second composite structure, the photoresist layer, the release agent layer, and the second substrate are heated to 105 degrees Celsius and kept at 105 degrees Celsius for 7 minutes, and the first voltage applied between the first substrate and the second substrate is 400 volts in the stage 1; the second composite structure, the photoresist layer, the release agent layer, and the second substrate are heated to 185 degrees Celsius and kept at 185 degrees Celsius for 20 minutes, and the second voltage applied between the first substrate and the second substrate is 1400 volts in the stage 2; the second composite structure, the photoresist layer, the release agent layer, and the second substrate are heated to 210 degrees Celsius and kept at 210 degrees Celsius for 30 minutes, the third voltage applied between the first substrate and the second substrate is 500 volts in the stage 3.

4. The method as claimed in claim 1, wherein the plurality of metal island structures are spaced apart from each other on the first surface of the first substrate and form a plurality of gaps.

5. The method as claimed in claim 4, wherein after laying metal nanospheres on the first surface of the first substrate, the metal nanospheres are distributed on a surface of the metal island structures, or in the plurality of gaps.

6. The method as claimed in claim 5, wherein a first size of the plurality of gaps is greater than a second size of the metal nanospheres, the metal nanospheres are in direct contact with the first substrate.

7. The method as claimed in claim 1, wherein a surface roughness of the first substrate is less than 1 nanometer.

8. The method as claimed in claim 1, wherein a thickness of the metal film is of 1 nanometer to 50 nanometers.

9. The method as claimed in claim 1, wherein annealing the metal film comprises:
    placing the first substrate with the metal film thereon in an annealing furnace;
    filling with nitrogen gas or inert gas the annealing furnace, or evacuating the annealing furnace; and
    heating the annealing furnace to a temperature of 140-240 degrees Celsius and keeping the metal film in the annealing furnace for 5 minutes to 90 minutes.

10. The method as claimed in claim 1, wherein a diameter of the metal nanospheres is of 2 nanometers to 100 nanometers.

11. The method as claimed in claim 1, wherein a baking temperature in baking the first composite structure is 140 degrees Celsius to 240 degrees Celsius, and a baking time in baking the first composite structure is 0.5 minutes to 1 minutes.

* * * * *